(12) United States Patent
Stadelmayer et al.

(10) Patent No.: US 6,224,255 B1
(45) Date of Patent: May 1, 2001

(54) TEMPERATURE PICKUP FOR OIL-FILLED VESSELS AND TEMPERATURE MEASUREMENT METHOD

(75) Inventors: Manfred Stadelmayer, Wenzenbach; Karsten Viereck, Diesenbach, both of (DE)

(73) Assignee: Maschinenfabrik Reinhausen GmbH, Regensburg (DE)

( * ) Notice: Subject to any disclaimer, the term of this patent is extended or adjusted under 35 U.S.C. 154(b) by 0 days.

(21) Appl. No.: 09/309,685

(22) Filed: May 11, 1999

(30) Foreign Application Priority Data

May 14, 1998 (DE) .............................................. 198 21 773

(51) Int. Cl.[7] ................................. G01K 1/12; G01K 7/25
(52) U.S. Cl. ........................ 374/152; 374/183; 374/170; 374/172; 340/595; 340/870.17; 702/130
(58) Field of Search ..................................... 374/152, 183, 374/141, 163, 145, 170–172; 340/646, 870.11, 595, 870.17; 702/130

(56) References Cited

U.S. PATENT DOCUMENTS

| | | | |
|---|---|---|---|
| 3,851,191 | * 11/1974 | Deebel et al. | 340/870.17 |
| 4,296,632 | 10/1981 | Bloomer et al. | |
| 5,257,864 | * 11/1993 | Nomura | 374/183 |
| 5,655,841 | * 8/1997 | Storm | 374/183 |
| 5,862,170 | * 1/1999 | Britton, Jr. et al. | 374/183 |

FOREIGN PATENT DOCUMENTS

| | | |
|---|---|---|
| 33 13 041 A1 | 10/1984 | (DE) . |
| 24 40 961 A1 | 3/1996 | (DE) . |

OTHER PUBLICATIONS

Temperaturmessung Mit Linearisierten NTC—Albert Haug, ULM, Germany pp. 255–258, Apr., 1979.
"Life Consumption Module" QualiTrol Corp., for the 109, Series Electronic Temperature Monitor, Bulletin QT–LCM, 2 pages, Oct. 1996.
"104 Series Universal Remote Mounted Thermometer" QualiTrol Corp., Bulletin QT–104–321, 2 pages, Jun. 1996.
"104 Series Remote Thermometer Controller" QualiTrol Corp., QT–104–2, 2 pages, Mar. 1994.
"Remote Indicating Thermometer" W/Scada Output, Bulletin QT–104–400, 2 pages (Prior to May 1999).
"Electronic Temperature Monitor", QualiTrol Corp., QT–108–200, 2 pages, Jan. 1994.
"Electronic Temperature Monitor", for Dry–Type Transformers QualiTrol Corp. QTQT2–108, Model 108–009–01, 2 pages, Jun. 1989.
"Electr.Tempe.Monitor W/Isolation Encl", for Dry–Type Transformers, QualiTrol Corp.,Bulletin. QT Enc–108, 2 pages, May 1994.

(List continued on next page.)

*Primary Examiner*—Diego Gutierrez
*Assistant Examiner*—Stanley J. Pruchnic, Jr.
(74) *Attorney, Agent, or Firm*—Herbert Dubno

(57) ABSTRACT

A temperature pickup for an oil-filled transformer or tap changer has within a resistance thermometer standard housing, the circuitry for duty-factor-modulated output of a measurement signal, interference circuitry which can slur the resulting wave form and an interface circuit which subjects the output signal to polarity reversal to produce an output symmetrical with respect to ground potential. This enables zero crossings to be detected and the time lapse between zero crossings or passages to be ascertained and the temperature calculated from the duty-factor ratio.

4 Claims, 4 Drawing Sheets

OTHER PUBLICATIONS

"Electronic Temperature Monitor",for Oil–Filled Transf., QualiTrol Corp.,Seri.QT–109–020,QT–109–100. 4 pages, Jan. 1994.

"4"Bimetal Thermometers", QualiTrol Corp., QT–150 (9/1994), 2 pages.

"5 "Bimetal Alarm Thermometers", QualiTrol Corp., Bulletin QT–165/167,2 pages, Jul. 1997.

"110–001 Series Differential Temperature Monitor For Load Tap Changers"/QualiTrol Corp.,Bull.QT–DTM, 4 pgs. Oct. 1996.

* cited by examiner

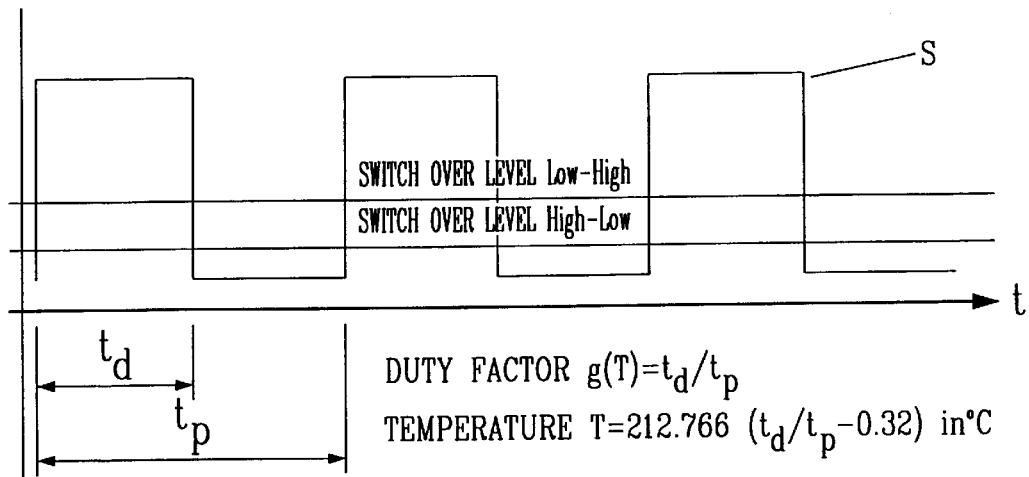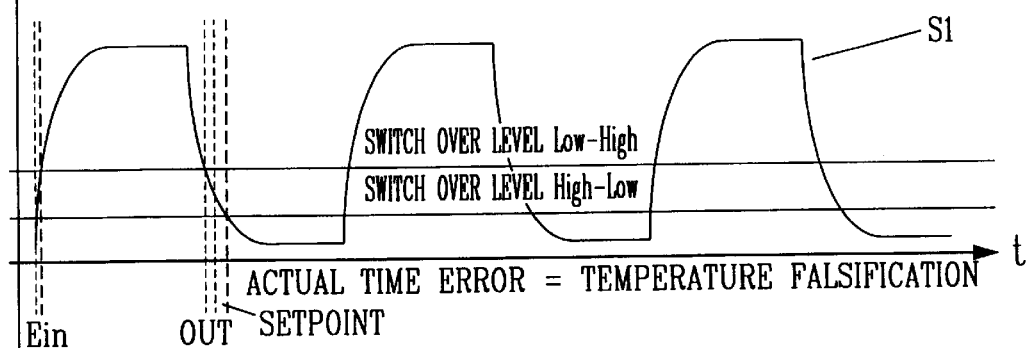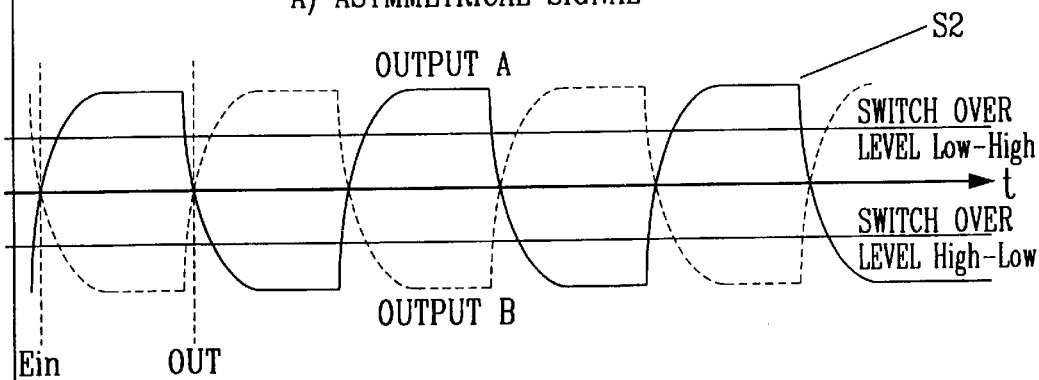
FIG. 4

TEMPERATURE PICKUP FOR OIL-FILLED VESSELS AND TEMPERATURE MEASUREMENT METHOD

FIELD OF THE INVENTION

Our present invention relates to a temperature pickup for measuring the temperature of an oil-filled vessel, especially for measurement of the oil temperature of a power transformer or tap changer. The invention also relates to a method of measuring a temperature and to a method of using such a temperature pickup.

BACKGROUND OF THE INVENTION

For the measurement of the oil temperature of a transformer and a tap changer, for example, the use of a resistance thermometer is common. Such resistance thermometers are available from a number of manufacturers and have generally standard dimensions and construction. In Germany, for example, the resistance thermometer must conform to the German Industrial Standard DIN 42554 and in other countries similar standards are applicable. In the United States and Canada, for instance, standard screw threads such as ⅜ inch NPT or ⅞-14 UNF are customary. The resistance thermometers which can be used are those made by Messko Hauser, Thermometerwerk Geraberg and Sika GmbH, all of Germany, and a Qualitrol Corp., of New York in the United States. Qualitrol supplies, for oil-filled power transformers and tap changers, thermometers of the Series 165/167, 104, 104-400. These units are described in the Qualitrol Corp. brochures QT-150, QT-165, QT-104-2, QT 104-321 and QT-104-400. Such units can have a housing or body provided with the electronic circuitry and a stem in which the resistor is housed, a screw thread being provided adjacent a prismatic formation which can be engaged by a wrench. The housing may be provided with connectors allowing cabling to electronic circuitry.

The thermometer is normally threaded into a thermometer pocket of the apparatus and can have a lower portion as a perforated protected tube in which a replaceable sensor insert is received. A vent can be provided on the housing as well.

Resistance thermometers of the aforementioned type have a number of drawbacks in the form known from the aforementioned brochures and the housing can have three or four conductor connectors as may be required or desirable.

Because of the contact resistances, the use of electromagnetic interference circuitry and the like, the measurement results of such systems can be falsified, especially as a result of time constants of various components of the electromagnetic interference circuitry. Such circuitry is frequently required to prevent interference from electromagnetic environments.

The output of the resistance thermometer frequently requires additional electronic processing to produce an output which can be provided to a display device or which is suitable as an input to a computer. This is a consequence of the fact that the output signals of some of the known resistance thermometers mentioned above are not compatible for computers or such display devices. Conventional resistance thermometers have a resistance variation $\Delta R$ which is dependent upon the temperature e so that $\Delta R = f(\theta)$. Electronic devices generally require standard well-defined signal levels, for example in the range of 0 to 10V or 0 to 20 mA or 0 . . . 1 mA. As a result, signal processing is practically always required to provide signals in this range for the downstream electronic units.

Finally, monitoring of the functioning of a resistance thermometer and thus the reliability and precision of the temperature measurement in use is not possible. In the past resistance thermometers have only been capable of being monitored by a separate reference measurement off line.

OBJECTS OF THE INVENTION

It is the principal object of the present invention to provide a temperature measurement pickup which avoids these drawbacks and can provide a precise, reliable temperature measurement, remote transmission of the measured signal and further processing of the measurement influence in a convenient manner.

It is also an object of the invention to provide an improved method of measuring temperature in an oil-filled vessel, especially a power transformer or a tap changer whereby drawbacks of earlier methods are avoided.

SUMMARY OF THE INVENTION

These objects are attained, in accordance with the present invention, with a temperature measurement pickup for an oil-filled vessel, especially a power transformer or a tap changer which comprises:

a standard resistance-thermometer housing;

a temperature sensor in the housing having a resistance temperature detector in contact with oil in the oil-filled vessel and generating a duty-factor-modulated output signal;

an interface circuit in the housing connected to the temperature sensor and receiving the output signal therefrom, the interface circuit subjecting the output signal to polarity reversal to produce a ground-potential-symmetrical output for detection of zero passages thereof; and electromagnetic interference circuitry in the housing connected to the temperature sensor and to the interface circuit.

The method of the invention can comprise the steps of:

(a) initially generating a temperature-dependent duty-factor-modulated output signal representing a temperature in the oil-filled vessel;

(b) subjecting the temperature-dependent duty-factor-modulated output signal to polarity reversal at a beginning of each flank thereof to produce a ground-potential-symmetrical output;

(c) detecting successive zero passages of the ground-potential-symmetrical output;

(d) determining time intervals between successive zero passages; and (e) calculating a duty factor from a ratio of the time intervals and a temperature in the oil-filled vessel from the duty factor.

The term duty-factor-modulated refers to a modulation based upon the ratio between the "high" and "low" flanks within a pulse so that $g(T) = t_d/t_p$ and the temperature is given by $T = 212.766 \, (t_d/t_p - 0.32)$ in degrees Celsius. It will be apparent that duty factor modulation is a special case of pulse width modulation where the full cycle has a period $t_p$ and the pulse has a width $t_d$. Such a signal has been shown in FIG. 4.

Duty-factor-modulated temperature sensors are manufactured, for example, by the UK firm, Ginsbury, although, as far as we are aware, such duty factor modulation with resistance thermometers has not been used for thermometer measurements of oil-filled vessels like power transformers and tap changers heretofore in which the sensor is set into the thermometer well of the unit.

According to a feature of the invention, all of the components of the pickup are incorporated in the standard conventional housing of such a resistance thermometer. This has insured full compatibility of the processing circuitry with the resistance thermometer and allows the resistance thermometer to have full capacity while enabling it to be fitted into the thermometer pocket of the transformer. It also allows retrofitting of a resistance thermometer with the processing circuitry of the invention. The pickup of the invention has a number of advantages. For example, it enables self-monitoring in a simple manner since a defect in the generated carrier frequency in a temperature proportional duty-factor-modulated output signal is readily ascertained in the case of an intact electric current supply.

Converters such as analog/digital converters are not required and the path lengths to a remote display or to further processing units for the digital measurement signals which are produced can be substantially greater than is customary. The measurement signal is available in digital form and can be directly processed by a microprocessor.

The method of the invention supplies a temperature-dependent duty-factor-modulated output. In other words pulses are generated whose keying ratios are direct measurements for the actual temperature. This signal can be provided with electromagnetic interference protection utilizing resistance-capacitance (RC) or inductive capacitance (LC) networks. The result of the use of such time constant networks is a flank slurring of the duty-factor-modulated signals without the present invention, such time constant networks can give rise to significant measurement errors. The reference to electromagnetic interference circuitry here can be considered to be equivalent to a reference to such RC networks and/or LC networks or other combinations of resistors, condensers and inductors. These networks tend to round the flanks of an otherwise sharp pulse train and cause deviations from a rectangular wave form.

By the generation of a polarity reversal at the beginning of each flank of the measurement signal, in effect a synthetic zero point is embedded in the curve of the measurement signal, thereby enabling in a simple manner, the detection of zero passages of the polarity reversing measurement signal, thereby providing information as to the measured temperature in terms of the intervals between the successive zero crossings.

With the invention, it is possible to tolerate the flank rounding resulting from the components required in the circuit for electromagnetic interference abatement since the zero passages are not adversely effected by such rounding. Objective information is thus obtained as to the measured temperature in a digital form and independently from such rounding of the flanks of the wave form.

According to a further feature of the invention, time-shift errors which may result in temperature errors can likewise be avoided.

The measured signal is obtained and processed in digital form, can be transmitted in digital form and can be further processed in digital form.

BRIEF DESCRIPTION OF THE DRAWING

The above and other objects, features, and advantages will become more readily apparent from the following description, reference being made to the accompanying drawing in which:

FIG. 1a is a side elevational view thereof;

FIG. 4 is a graph of the wave forms relevant to the invention.

SPECIFIC DESCRIPTION

Figure 1:
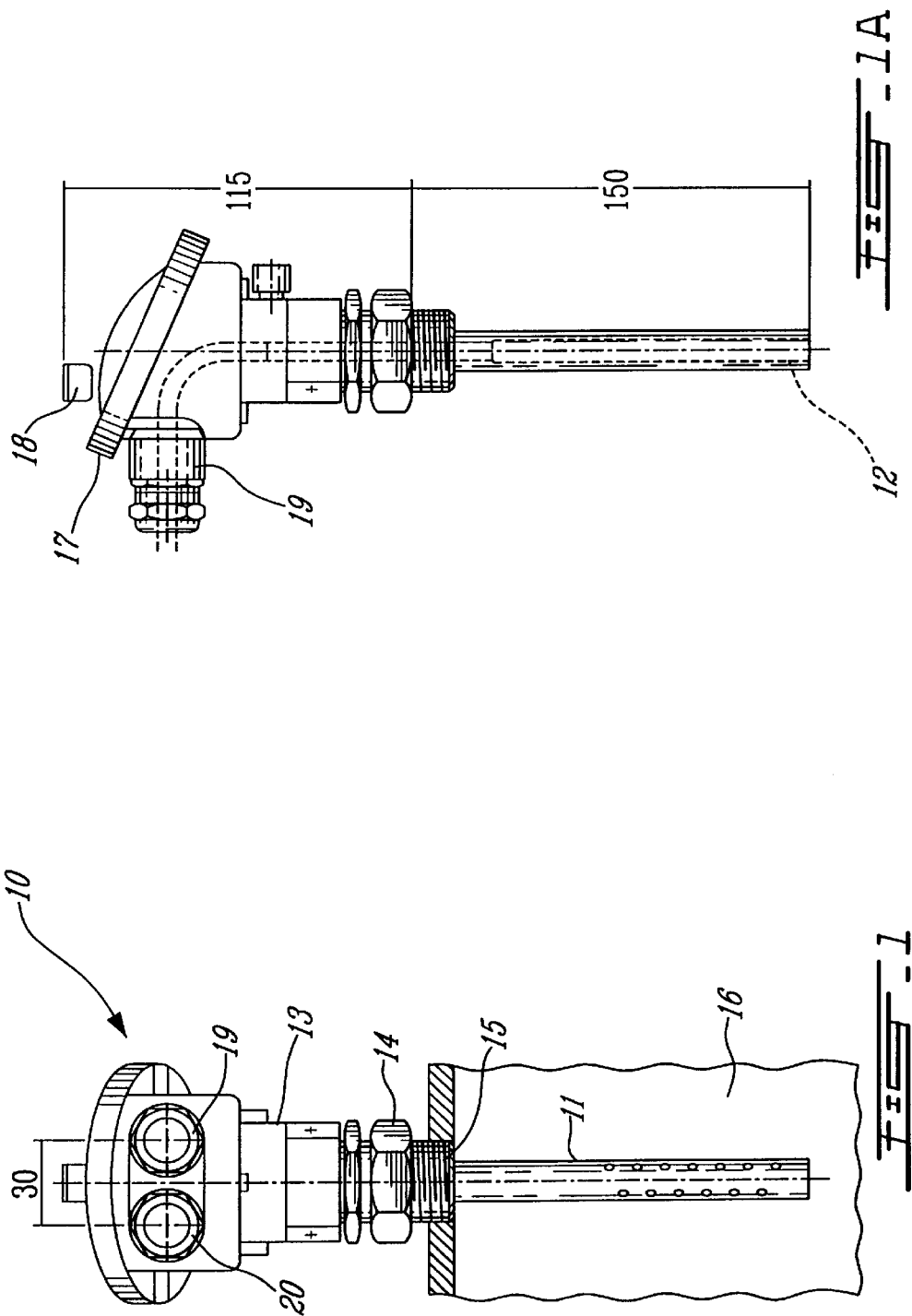
FIG. 1 a front elevational view of a resistance thermometer, the housing of which is provided with the circuitry of the invention.

As can be seen from FIG. 1, a resistance thermometer 10 can comprise a perforated tube 11 within which a resistance sensor 12 is received and which can be replaceable if desired. The housing 13 of this sensor is formed with a hexagonal head 14 which can be engaged by a wrench and a standard thread 15 whereby the resistance thermometer is threaded into a well 16 of a housing filled with oil and containing the windings and other apparatus of a power transformer or tap changer. The housing has a cover 17, a vent 18 and connections 19 and 20 to the respective cables.

Figure 2:
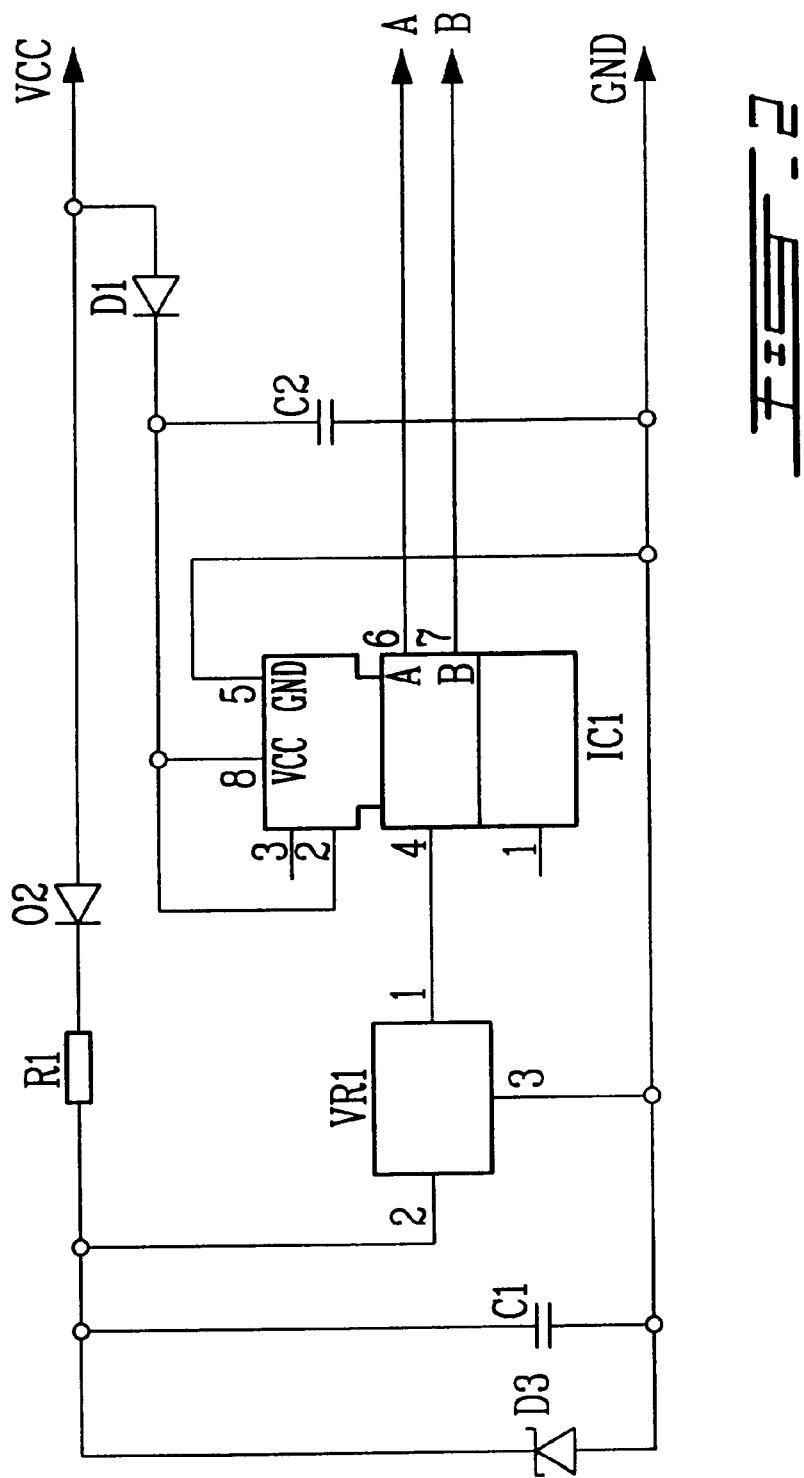
FIG. 2 is a circuit diagram illustrating the pickup of the invention.

FIG. 2 shows diagrammatically the individual components of the temperature-measurement signal processor, all of which are received within the conventional housing 13 of the resistance thermometer 10.

The most important component of the temperature-measurement signal processor is a temperature sensor VR1 which serves as the basic temperature detector. It is connected with an interface circuit IC1. The interface circuit IC1 enables a permanent polarity reversal of the measurement signal supplied by the temperature sensor VR1 and delivers the thus-modified measurement signal at its outputs A and B.

The further components D1, D2, D3, C1 and C2 serve for electromagnetic interference protection of the apparatus and the temperature-measurement signal processor. Resistor R1 serves to limit the charging current of capacitor C1 and the leakage current of the zener diode D3. The electric time constant $t_z$ for voltage rectification, i.e. the damping of the effective supply voltage, is given by R1×C1. C2 is the charging condenser for the supply voltage of the circuit IC1. D1 is a rectifier diode for blocking negative voltage spikes in the supply voltage of IC1 and D2 has the same function for the supply voltage of VR1. Zener diode D3 is a voltage limiting diode which becomes conductive when a defined voltage level is reached.

The temperature sensor VR1 used generates a temperature-proportional duty-factor-modulated output signal with a frequency f of about 3 kHz.

Between the terminals GND and VCC the supply voltage is applied and the terminals A and B have the processed measurement signal thereacross and which is available for further processing or remote transmission.

The temperature sensor VR1 has a sensor structure burned into a chip so that additional calibration is unnecessary. Corresponding temperature sensors are commercially available.

Figure 3:
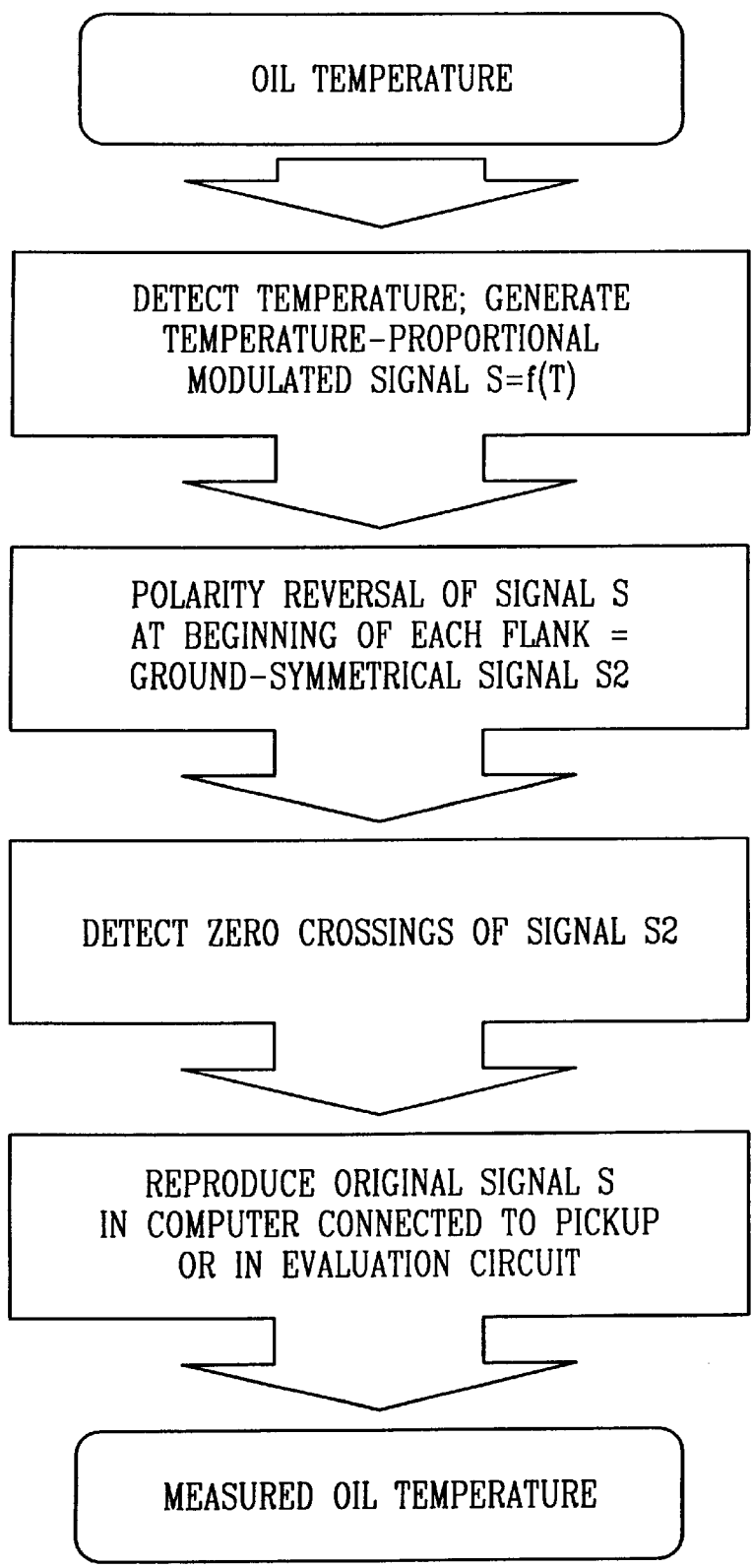
FIG. 3 is an information flow diagram illustrating the method.

FIG. 3 is an information flow diagram or algorithm of the process of the invention using the above-described temperature-measurement signal processor.

Initially, in dependence upon the oil temperature prevailing at the measurement site, the temperature sensor VR1 generates a temperature-proportional duty-factor-modulated output signal S.

If this signal would traverse a state-of-the-art, conventional, known electromagnetic interference circuit, there is a loss of sharpness (rounding or slurring) of the flanks and a correspondingly falsified signal S1 which deviates from the originally generated sharp digital signal S. This flank slurring is a consequence of the time constants of the components used. When, according to the invention, there is a permanent polarity reversal of the signal S by the interface circuit IC1, the result is a signal symmetrical about the ground potential. The flank slurring of this signal S2 by the electromagnetic interference circuitry does not influence the pulse-width ratio and hence the temperature measurement since the devices receiving the measured value or any computer connected to the terminals A, B, respond only to the zero crossings or passages of the signal S2 in the further signal processing.

Ultimately, the ratio between the individual zero passages of the signal S2 serves as the measure of the oil temperature.

In FIG. 4 the signals S, S1 and S2 previously described have been illustrated diagrammatically and as a function of time. At the top of this FIGURE, the sharp, digital pulse-width modulated and temperature-proportional meandering signal S has been shown. The duty factor (keying ratio) $g(T)=t_d/t_p$, i.e. the ratio of the pulse width $t_d$ to the total cycle duration or period $t_p$, defines the temperature $T=212.766(t_d/t_p-0.32)°$ C.

The signal S1 plotted at the center of FIG. 4 represents, as has been noted, the original signal after it has passed through a conventional electromagnetic interference filter circuit. The slurring or rounding of the flanks is clearly visible in this portion of the FIGURE. Also shown is a further phenomenon which can arise in pulse-width modulation and that is a time error or offset which can give rise to falsification of the temperature measurement. It can be noted, in this connection that, as a result of the time constants of the circuit components used, the duty factor can vary, thereby yielding the inequality:

$$\frac{t_d + \Delta t_1}{t_p + \Delta t_1} \neq \frac{t_d}{t_p}.$$

This has been shown at the center of FIG. 4. The dotted lines show the theoretical switching points of the signal and the dot-dash lines show the erroneous value which is outputted in the practical case and the additional effect of switching hysteresis.

In FIG. 4, therefore, the signal S in the uppermost timing diagram represents a theoretical signal from the temperature measuring unit VR1, operating without a load or output impedance. The signal S1 of the center timing diagram is a true signal resulting from operation of the measuring unit VR1 under load and without the benefit of the invention. The signal S2 of the lower timing diagram is the signal generated in accordance with the invention. Here the polarity reversal at the beginning of each flank at both of the outputs A, B can be clearly seen.

The respective zero passages of the signal S2 can be detected in a simple manner and the time intervals between them can yield the same information as is given by the duty factor or keying ratio of the original signal S, namely the instantaneous temperature. In other words, with appropriate means, for example a comparator circuit containing an operational amplifier with low hysteresis, from the output S2 the original signal S can be reproduced. Neither slurring of the flanks nor additional errors as a result of time constants influence the result and a highly precise temperature can be obtained.

We claim:

1. A temperature-measurement pickup for an oil-filled vessel, comprising:

a standard resistance-thermometer housing;

a temperature sensor in said housing having a resistance temperature detector in contact with oil in said oil-filled vessel and generating a duty-factor-modulated output signal;

an interface circuit in said housing connected to said temperature sensor and receiving said output signal therefrom, said interface circuit subjecting said output signal to polarity reversal to produce a ground-potential-symmetrical output for detection of zero passages thereof; and electromagnetic interference circuitry in said housing connected to said temperature sensor and to said interface circuit.

2. The temperature-measurement pickup defined in claim 1 wherein said vessel is a power-transformer housing.

3. The temperature-measurement pickup defined in claim 1 wherein said vessel is a tap-changer housing.

4. A method of measuring temperature in an oil-filled vessel, comprising the steps of:

(a) initially generating a temperature-dependent duty-factor-modulated output signal representing a temperature in said oil-filled vessel;

(b) subjecting said temperature-dependent duty-factor-modulated output signal to polarity reversal at a beginning of each flank thereof to produce a ground-potential-symmetrical output;

(c) detecting successive zero passages of said ground-potential-symmetrical output;

(d) determining time intervals between successive zero passages; and (e) calculating a duty factor from a ratio of said time intervals and a temperature in the oil-filled vessel from the duty factor.

* * * * *